US008283485B2

(12) United States Patent
Norman (10) Patent No.: US 8,283,485 B2
(45) Date of Patent: Oct. 9, 2012

(54) PROCESS FOR SELECTIVELY DEPOSITING COPPER THIN FILMS ON SUBSTRATES WITH COPPER AND RUTHENIUM AREAS VIA VAPOR DEPOSITION

(75) Inventor: John Anthony Thomas Norman, Encinitas, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 620 days.

(21) Appl. No.: 12/139,585

(22) Filed: Jun. 16, 2008

(65) Prior Publication Data

US 2008/0318418 A1      Dec. 25, 2008

Related U.S. Application Data

(60) Provisional application No. 60/945,415, filed on Jun. 21, 2007, provisional application No. 60/945,748, filed on Jun. 22, 2007.

(51) Int. Cl.
 *H01L 21/443* (2006.01)
(52) U.S. Cl. ............. 556/10; 556/11; 556/12; 556/113; 427/248.1; 428/697; 438/687
(58) Field of Classification Search ............. 556/10–12, 556/113; 427/248.1; 428/697; 438/687
See application file for complete search history.

(56) References Cited

U.S. PATENT DOCUMENTS

| 6,365,502 | B1 | 4/2002 | Paranjpe et al. |
| 6,489,235 | B2 | 12/2002 | Gilton et al. |
| 6,893,915 | B2 | 5/2005 | Park et al. |
| 6,974,768 | B1 | 12/2005 | Kailasam |
| 7,034,169 | B1 | 4/2006 | Norman |
| 7,071,558 | B2 | 7/2006 | Hu |
| 7,169,706 | B2 | 1/2007 | Lopatin et al. |
| 7,205,422 | B2 | 4/2007 | Norman |

(Continued)

FOREIGN PATENT DOCUMENTS

JP      11-274105 A2      10/1999

(Continued)

OTHER PUBLICATIONS

Li Zhengwen et al, Atomic Layer Deposition of Ultrathin Copper Metal Films from a Liquid Copper(I) Amidinate Precursor, J. Electrochemical Soc., 2006, 153 (11), pp. C787-C794.

(Continued)

*Primary Examiner* — Fernando L Toledo
*Assistant Examiner* — Peter Bradford
(74) *Attorney, Agent, or Firm* — Joseph D. Rossi; Rosaleen P. Morris-Oskanian (57) ABSTRACT

A process for preparing a multi-layer substrate is described herein. In one embodiment, the process provides a multi-layer substrate comprising a first layer and a second layer where the process comprises the steps of providing the first layer comprising a barrier area and a copper area; and depositing the second layer comprising copper onto the first layer wherein the depositing provides the second layer comprising a first thickness ranging from about 20 Angstroms to about 2,000 Angstroms onto the barrier area and a second thickness ranging from about 0 Angstroms to about 1,000 Angstroms onto the copper area in the first layer wherein the first thickness is greater than the second thickness.

7 Claims, 3 Drawing Sheets

U.S. PATENT DOCUMENTS

| | | | |
|---|---|---|---|
| 2005/0043184 A1* | 2/2005 | McCleskey et al. | 505/100 |
| 2005/0087138 A1 | 4/2005 | Ueno | |
| 2006/0145142 A1 | 7/2006 | Norman | |
| 2007/0054487 A1 | 3/2007 | Ma et al. | |
| 2007/0072415 A1 | 3/2007 | Suzuki | |
| 2007/0082474 A1 | 4/2007 | Shih et al. | |

FOREIGN PATENT DOCUMENTS

| | | | |
|---|---|---|---|
| JP | 2002-193988 A2 | 7/2002 | |

OTHER PUBLICATIONS

Hoon Kim et al, Cu wettability and diffusion barrier property of Ru thin films for Cu metallization, J. Electrochemical Soc., 2005, 152 (8) pp. G594-G600.

Hyun-Bae Lee, et al; "Enhancement of Iodine Adsorption on Ruthenium Glue Layer for Seedless CECVD of Cu"; Electrochemical and Solid-State Letters Electrochem. Soc USA; vol. 8; No. 2; Feb. 2005; pp. C39-C42; XP-002495932.

* cited by examiner

PROCESS FOR SELECTIVELY DEPOSITING COPPER THIN FILMS ON SUBSTRATES WITH COPPER AND RUTHENIUM AREAS VIA VAPOR DEPOSITION

CROSS-REFERENCE TO RELATED APPLICATIONS

This patent application claims the benefit of provisional patent application U.S. Ser. No. 60/945,415, entitled "Process for Forming Continuous Copper Thin Films Via Vapor Deposition" filed Jun. 21, 2007 and provisional patent application U.S. Ser. No. 60/945,748, entitled "Process for Forming Continuous Copper Thin Films Via Vapor Deposition" filed Jun. 22, 2007, incorporated herein by reference.

BACKGROUND OF THE INVENTION

The semiconductor industry uses metal-containing interconnects, such as copper (Cu) and alloys thereof, in electronic devices such as, for example, state of the art microprocessors. The metal-containing interconnects, which may be embedded fine metal lines, form the three dimensional grid upon which millions of transistors at the heart of the microprocessor can communicate and perform complex calculations. In these and other applications, copper or alloys thereof may be chosen over other metals such as, for example, aluminum because copper is a superior electrical conductor, thereby providing higher speed interconnections of greater current carrying capability.

Interconnect pathways within electronic devices are typically prepared by the damascene process, whereby photolithographically patterned and etched trenches and vias in the dielectric insulator are coated with a conformal thin layer of a diffusion barrier material. A diffusion barrier layer is typically used in conjunction with a metal or copper layer to prevent detrimental effects caused by the interaction or diffusion of the metal or copper layer with other portions of the integrated circuit. Exemplary barrier materials include, but are not limited to, titanium, tantalum, tungsten, chromium, molybdenum, zirconium, ruthenium, rhodium, iridium, vanadium, and/or platinum as well as carbides, nitrides, carbonitrides, silicon carbides, silicon nitrides, and silicon carbonitrides of these materials and alloys comprising same. In certain processes, such as when, for example, the interconnect comprises copper, the diffusion barrier layer may be coated with a thin 'seed' or 'strike' layer of copper, prior to completely filling in the features with pure copper. In still other cases, the seed layer of copper may be replaced by—or used in addition to—an analogous cobalt or similar conducting thin film 'glue' layer. Excess copper may then be removed by the process of chemical mechanical polishing. Since the smallest features to be filled can be less than 0.2 microns wide and over 1 micron deep, it is preferable that the copper seed layer, copper glue layer and/or the diffusion barrier layers be deposited using metallization techniques that are capable of evenly filling these features, without leaving any voids, which could lead to electrical failures in the finished product.

Numerous methods such as ionized metal plasma (IMP), physical vapor deposition (PVD), chemical vapor deposition (CVD), atomic layer deposition (ALD), plasma-assisted chemical vapor deposition (PACVD), plasma-enhanced chemical vapor deposition (PECVD), electroplating, and electroless plating have been used to deposit a metal-containing layers such as copper, diffusion barrier, and/or other layers. Among the foregoing, vapor deposition methods, such as CVD and ALD using one or more organometallic precursors, may be the most promising methods for forming metal and/or metal-containing films because these methods provide excellent step coverage for high aspect ratio structures and good via filling characteristics, and better processing control over film thickness. In a typical CVD process, a vapor of a volatile organometallic precursor containing the desired metal is introduced to a substrate surface whereupon a chemical reaction occurs in which a thin film containing the metal as a compound or as a pure element is deposited on the substrate. Since the metal is typically delivered in a vapor form as a volatile precursor, it can access both vertical and horizontal surfaces to provide an evenly distributed thin film. In a typical ALD process, a volatile organometallic precursor is alternately pulsed into a reactor with a reagent gas such that self-limiting alternating monolayers of precursor/reagent are deposited on the substrate wherein the monolayers react together to form a metal film or a metal-containing film which is subsequently reduced to metal or used as deposited. For example, if a copper organometallic precursor was reacted with a suitable oxidant in an ALD process, the resulting cuprous oxide or cupric oxide monolayer or multilayer could be used for semiconductor applications or reduced to copper metal.

Vapor deposition processes such as CVD and ALD allow one to control thickness of the resulting film by controlling process conditions such as time and temperature and precursor and reagent flow and pressures. Typically, higher pressures, higher precursor flow and higher wafer temperatures may tend to provide thicker films for a given unit of processing time. For example, once a given 'process window' for a CVD process has been established, a rate of film deposition can be determined and, from that value, a particular film thickness can be deposited by selecting an appropriate deposition time for that process. Like the CVD process, once an ALD process has been established in which alternating pulses of organometallic precursor and reagent gas are cycled over the substrate to grow the metal film, the thickness of the film can be determined by controlling the total number of cycles used.

For certain applications, such as copper seed layers, it is desirable that the copper film be formed as thin as possible while still being continuous and unbroken. Since copper CVD processes tend to proceed by copper metal nuclei forming onto the substrate which slowly grow larger until the nuclei eventually touch each other to form a continuous film, the minimum film thickness achievable is governed by the point at which the copper nuclei coalesce. These nuclei grow larger by two processes. First, copper atoms which are deposited onto the surface of the barrier, seed, and/or glue layer migrate onto the nuclei to increase their size. Secondly, fresh copper atoms are grown directly onto the copper nuclei. Thus, copper is deposited both onto the diffusion barrier and/or glue layer as well as the copper already deposited.

A similar situation is encountered in copper ALD processes whereby a volatile organometallic copper precursor is alternately pulsed into a reactor with a reagent gas such that self-limiting alternating monolayers of precursor/reagent are deposited on the substrate such that the monolayers react together to form a copper film. In this way, copper can be deposited onto the barrier and/or glue layer and the existing copper surface or seed layer. The reference Zhengwen, Li, Antti Rahtu, and Roy Gordon, *Journal of the Electrochemical Society*, 153 (111) C787-C794 (2006) provides an example of a typical copper ALD process where additional copper is deposited onto an existing copper layer at a growth rate of 0.5 Angstroms per cycle. Thus, any copper nuclei, or larger localized areas of copper metal deposited onto a barrier or seed layer, can grow by surface copper atoms diffusing along the surface of the barrier material onto the nuclei or area or by fresh copper being grown directly onto the nuclei or area. Additionally, certain commonly used metals that are used for barrier layers such as tantalum may tend to promote copper agglomeration into a discontinuous film in a manner similar to that of water beading on a waxed surface (see, e.g., H. Kim, T. Koseki. T. Ohba, T. Ohta, Y. Kojima, H. Sato, Y. Shimogaki, *Journal of the Electrochemical Society,* 152(*), G594-G600 (2005)). Such a discontinuous copper film may lead to subsequent problems during copper electroplating. Thus, it is challenging to achieve a thin yet continuous copper film on a barrier, seed, and/or glue layer—including those layers containing ruthenium.

Accordingly, there is a need for a process wherein the copper selectively deposits onto a metal-containing barrier, seed, and/or layer in a reduced thickness or amount than that of the copper previously deposited.

BRIEF SUMMARY OF THE INVENTION

The present invention provides in one aspect a process that satisfies at least one of the foregoing needs for preparing a multi-layered substrate comprising a first layer and a second layer that comprises the steps of providing a first layer comprising a ruthenium area and a copper area; depositing a second layer comprising copper onto the first layer using at least one precursor having any one of the following formulas (Ia), (Ib), and (II):

wherein M is copper;
wherein X is selected from oxygen and $NR^5$;
wherein $R^1, R^2, R^3$, and $R^5$ are each independently selected from a hydrogen atom; a halogen atom; a nitro group having a formula $NO_2$; an alkyl having a formula $C_nH_{2n+1}$ wherein n is a number ranging from 1 to 20; a fluoroalkyl having the formula $C_nH_xF_y$ wherein the product of (x+y) equals the product of (2n+1) and n is a number ranging from 1 to 20; an alkylsilane having a formula $(R^6)_3Si$ wherein $R^6$ is each independently an alkyl, an alkoxy or an amide comprising from 1 to 20 carbon atoms; an aryl group comprising from 6 to 12 carbon atoms; an alkyl-substituted aryl comprising from 6 to 12 carbon atoms; a fluoroalkyl substituted aryl comprising from 6 to 12 carbon atoms; a fluoroaryl comprising from 6 to 12 carbon atoms; an ether having a formula $(CH_2)_nO(C_mH_{2m+1})$ where n and m are independently a number ranging from 1 to 20; a fluoroether having a formula $(C_nH_xF_y)O(C_mH_wF_z)$ wherein (x+y)=2n, (w+z)=(2m+1), and n and m are each independently a number ranging from 1 to 20; a silylether having a formula $(R^7)_3SiO$ wherein $R^7$ is each independently an alkyl comprising from 1 to 20 carbon atoms or an aryl comprising from 6 to 12 carbon atoms; an alkoxy comprising from 1 to 20 carbon atoms; and an amide comprising from 1 to 20 carbon atoms;

wherein $R^4$ is selected from an alkyl having a formula $C_nH_{2n+1}$ wherein n is a number ranging from 1 to 20; a fluoroalkyl having the formula $C_nH_xF_y$ wherein the product of the (x+y) equals the product of (2n+1) and n is a number ranging from 1 to 20; an alkylsilane having a formula $(R^6)_3Si$ wherein $R^6$ is each independently an alkyl, an alkoxy or an amide comprising from 1 to 20 carbon atoms; an aryl comprising from 6 to 12 carbon atoms; an alkyl-substituted aryl comprising from 6 to 12 carbon atoms; a fluoroalkyl substituted aryl comprising from 6 to 12 carbon atoms; a fluoroaryl comprising from 6 to 12 carbon atoms; an ether having a formula $(CH_2)_nO(C_mH_{2m+1})$ where n and m are independently a number ranging from 1 to 20; a fluoroether having a formula $(C_nH_xF_y)O(C_mH_wF_z)$ wherein (x+y)=2n, (w+z)=(2m+1), and n and m are each independently a number ranging from 1 to 20; a silylether having a formula $(R^7)_3SiO$ wherein $R^7$ is each independently an alkyl group comprising from 1 to 20 carbon atoms or an aryl group comprising from 6 to 12 carbon atoms; an alkoxy comprising from 1 to 20 carbon atoms; and an amide comprising from 1 to 20 carbon atoms and wherein $R^4$ associates with L by having a hydrogen, an atom, or a group removed;

wherein L is a ligand selected from an alkylnitrile comprising from 2 to 20 carbon atoms; a silylnitrile having the formula $(R^8)_3SiCN$ wherein $R^8$ is each independently an alkyl, an alkoxy, or an amide comprising from 1 to 20 carbon atoms; an alkyne comprising from 1 to 20 carbon atoms; a silylalkyne having a formula $(R^9)_3SiCCR^{10}$ wherein $R^9$ is each independently an alkyl, an amide, or an alkoxy comprising from 1 to 20 carbon atoms and $R^{10}$ is hydrogen, an alkoxy, an amide, or an alkyl comprising from 1 to 20 carbon atoms; a silylalkyne having a formula $(R^{11})_3SiCCSi(R^{11})_3$ wherein $R^{11}$ is each independently an alkyl, an amide, or an alkoxy comprising from 1 to 20 carbon atoms; an alkene, diene, or triene comprising from 1 to 20 carbon atoms; a silylalkene having a formula $(R^{12})_3SiCR^{13}C(R^{13})_2$ wherein $R^{12}$ is each independently an alkyl, an alkoxy, an aryl, a vinyl, or an amide comprising from 1 to 20 carbon atoms and $R^{13}$ is each independently a hydrogen, an alkyl comprising from 1 to 20 carbon atoms, or an aryl comprising from 6 to 12 carbon atoms; a bis(silyl)alkene having the formula $(R^{14})_3SiCR^{13}CR^{13}Si(R^{14})_3$ wherein $R^{14}$ is each independently an alkyl, an alkoxy, or an amide comprising from 1 to 20 carbon atoms and $R^{13}$ is each independently a hydrogen atom or an alkyl comprising from 1 to 20 carbon atoms; an allene comprising from 3 to 20 carbons; an allene having a formula $(R^{15})_2CCC(R^{15})_2$ where $R^{15}$ is each independently a hydrogen atom or an alkyl silane having a formula $(R^{16})_3Si$ wherein $R^{16}$ is each independently an alkyl, an amide, or an alkoxy comprising from 1 to 20 carbon atoms; an alkylisocyanide having a formula $R^{17}NC$ wherein $R^{17}$ is an alkyl comprising from 1 to 20 carbon atoms; a silylisocyanide having a formula $(R^{18})_3SiNC$ wherein $R^{11}$ is each independently an alkyl comprising from 1 to 20 carbon atoms; and an aryl group comprising from 6 to 12 carbon atoms and wherein L associates with $R^4$ by having a hydrogen, an atom, or a group removed;

wherein an organometallic bond between M and L is selected from 2 single bonds and 1 single bond; and wherein the depositing provides the second layer comprising a first thickness ranging from about 20 Angstroms to about 2,000 Angstroms onto the ruthenium area and provides a second layer comprising a second thickness ranging from about 0 to about 1,000 Angstroms onto the copper area and wherein the first thickness is greater than the second thickness. In one particular embodiment, at least a portion of the depositing step is conducted in the presence of the reducing agent.

In another aspect, there is provided a process for preparing a multi-layered substrate comprising a first layer and a second layer comprising: providing the first layer comprising a barrier area comprising at least one chosen from titanium, tantalum, tungsten, chromium, molybdenum, zirconium, ruthenium, rhodium, iridium, vanadium, platinum, and combinations thereof and a copper area; depositing the second layer comprising copper onto the first layer using at least one precursor having any one of the formulas (Ia), (Ib), and (II) described herein to provide the multi-layered substrate and wherein the depositing provides the second layer comprising a first thickness ranging from about 20 Angstroms to about 2,000 Angstroms onto the ruthenium area and provides a second layer comprising a second thickness ranging from about 0 to about 1,000 Angstroms onto the copper area wherein the first thickness is greater than the second thickness and wherein at least a portion of the depositing is conducted in the presence of a reducing agent.

In yet another aspect, there is provided a process for preparing a multi-layered substrate comprising a first layer and a second layer, the process comprising: providing the first layer comprising a barrier area comprising at least one chosen from titanium, tantalum, tungsten, chromium, molybdenum, zirconium, ruthenium, rhodium, iridium, vanadium, platinum, and combinations thereof and a copper area; and depositing the second layer comprising copper onto the first layer using at least one copper precursor to provide the multi-layered substrate wherein the depositing provides the second layer comprising a first thickness ranging from about 20 Angstroms to about 2,000 Angstroms onto the barrier area and provides the second layer comprising a second thickness ranging from about 0 to about 1,000 Angstroms onto the copper area wherein the first thickness is greater than the second thickness and wherein at least a portion of the depositing is conducted in the presence of a reducing agent.

DETAILED DESCRIPTION OF THE INVENTION

The process described herein allows one to deposit a self-healing and self-terminating copper layer onto a metal-containing barrier, seed, and/or glue layer, such as, for example, metal layers or areas containing ruthenium, and not onto copper layers or areas that were previously deposited or, in certain embodiments, at substantially diminished deposition rates onto copper areas that were previously deposited. The newly deposited copper layer or additional copper layer is "self-healing" in that it fills in the spaces between the areas of copper previously deposited and, if copper agglomeration begins to occur, it fills in the exposed barrier, seed, and/or glue layer to restore the previously deposited copper film to a continuous condition. Further, the newly deposited copper or additional copper layer is "self-terminating" in that once the barrier, seed, and/or glue layer is substantially coated with the newly deposited copper layer, either no further copper deposition occurs onto the previously deposited copper layer or area, or further deposition is greatly diminished and therefore the effective growth of copper ceases thereby creating at least two thicknesses in the additional or second copper layer. Thus, depending upon processing conditions, control of the deposition time may also ensure a substantially continuous copper film deposed upon at least a portion of a metal layer containing ruthenium. The term "substantially continuous copper film" describes a film where the copper is <200 Angstroms thick and forms an essentially unbroken and continuous film of copper metal. In certain preferred embodiments, the process described herein uses the volatile metal β-ketoiminate complexes described in U.S. Pats. No. 7,034,169 and 7,205,422 which are owned by the assigned of the present application and incorporated herein by reference in their entirety. In these embodiments, the volatile metal β-ketoiminate and β-diiminate complexes provide particular advantages for the process described herein because the copper preferentially deposits onto the ruthenium-containing layer or area rather than on the previously deposited copper layer(s) or area(s). In other words, for those layers having a combination of a barrier material or area such as ruthenium and copper, additional copper deposited using the precursors described herein provide an additional thickness of copper or additional copper layer onto the barrier metal or ruthenium (e.g., at least 50 nanometer (nm) or less) but no increase or a reduced thickness on the previously deposited copper.

The process described herein is used to make a multi-layered substrate having at least two layers: a first layer and a second layer. The first layer has a barrier area or an area comprising a barrier material comprising at least one chosen from titanium, tantalum, tungsten, chromium, molybdenum, zirconium, ruthenium, rhodium, iridium, vanadium, platinum, and combinations thereof and a previously deposited copper area. The second layer comprising copper is deposited onto the first layer comprising a barrier material such as ruthenium and a copper area such as the previously deposited copper in at least two thicknesses or a first thickness and a second thickness, respectively. In certain embodiments, the process described herein allows one to deposit an additional or second layer of copper having a first thickness onto the barrier area of the first layer wherein the first thickness has a range of from about 20 Angstroms (Å) to about 2,000 Å. By a disclosure that the first thickness of the second layer is in a range from about 20 Å to about 2,000 Å, Applicants intend to recite that the thickness can be selected from about 20, about 30, about 40, about 50, about 60, about 70, about 80, about 90, about 100, about 150, about 200, about 250, about 300, about 350, about 400, about 450, about 500, about 550, about 600, about 650, about 700, about 750, about 800, about 850, about 900, about 950, about 1,000, about 1,050, about 1,200, about 1,250, about 1,300, about 1,350, about 1,400, about 1,450, about 1,500, about 1,550, about 1,600, about 1,650, about

1,700, about 1,750, about 1,800, about 1,850, about 1,900, about 1,950, and about 2,000. Additionally, the first thickness value can be within any range from about 20 to about 2,000 (for example, in one embodiment the first thickness is in a range from about 50 to about 1,000), and this includes any combination of ranges between about 20 Å to about 2,000 Å (for example, the first thickness value is in a range from about 100 to about 350, or from about 700 to about 800). Likewise, all other ranges disclosed herein should be interpreted in a manner similar to these two examples. As previously mentioned, the second layer comprising copper is deposited onto a barrier layer comprising ruthenium and/or other transition metal in a first thickness using the volatile metal β-ketoiminate or β-diiminate complexes described in U.S. Pat. No. 7,205,422 or other copper-containing precursors used in the art or disclosed herein and a suitable reducing reagent gas such as hydrogen or formic acid in an ALD, CVD, or pulsed CVD deposition process wherein the processing conditions (e.g., time, temperature, pressure, etc.) are suitable to selectively deposit a fresh copper or second layer onto ruthenium in a greater thickness than that on the previously deposited copper area or the copper area on the first layer.

The second layer deposited onto the copper area of the first layer is deposited in a second thickness wherein the second thickness has a range of from about 0 Angstroms (Å) to about 1,000 Å. In certain embodiments, the second thickness may be substantially 0, e.g., no additional second layer of copper is deposited onto the copper area. In other embodiments, an additional thickness of copper is deposited onto the copper area but in an amount that is less than that on the barrier material area. In certain embodiments, the second thickness is at least about 90% less, at least about 80% less, at least about 70% less, at least about 60% less, at least about 50% less, at least about 40% less, at least about 30% less than the first thickness. In the embodiments wherein the second layer is deposited onto the copper area in a second thickness, the second thickness is in a range of from about 0 Å to about 1,000 Å, Applicants intend to recite that the second thickness can be selected from about 0, about 10, about 20, about 30, about 40, about 50, about 60, about 70, about 80, about 90, about 100, about 150, about 200, about 250, about 300, about 350, about 400, about 450, about 500, about 550, about 600, about 650, about 700, about 750, about 800, about 850, about 900, about 950, and about 1,000. Additionally, the second thickness value can be within any range from about 0 to about 1,000 (for example, in one embodiment the second thickness is in a range from about 50 to about 1,000), and this includes any combination of ranges between about 0 Å to about 1,000 Å (for example, the first thickness value is in a range from about 100 to about 350, or from about 700 to about 800). Likewise, all other ranges disclosed herein should be interpreted in a manner similar to these two examples.

In certain embodiments, the additional thickness of the copper film or second layer is deposited upon the barrier layer and substantially no additional thickness or second layer is deposited onto the previously deposited copper area. In this or other embodiments, the fresh copper that is deposited during the deposition of the second layer comprising copper may act to "fill in" the gaps of the previously deposited copper area to provide a substantially continuous copper film but will not add a substantial additional thickness to the copper film. Thus, in one embodiment, the process provides an additional copper layer or an ultra thin copper film onto the ruthenium area whereby the film's resulting thickness is obtained in a self-limiting reaction involving copper precursor, the reducing agent such as, for example hydrogen or formic acid, and the barrier layer ruthenium. While not wishing to be bound by theory, it is considered that the ruthenium activates hydrogen or formic acid towards reducing the copper precursor at the ruthenium surface and as the copper film starts to grow and coat the ruthenium surface, some hydrogen may still diffuse through the copper to the ruthenium interface where it becomes activated and can diffuse back to the copper surface where it reacts with fresh copper precursor to deposit more copper metal. The process continues until the copper film thickness reaches a certain value whereupon the above described hydrogen diffusion ceases at which point either no additional copper can be deposited onto the exposed surface or the rate of further copper deposition greatly decreases.

In addition to the utility of creating thin and continuous copper 'seed' layers, the process described herein is also highly useful towards filling deeply etch via and trench structures which are lined with barrier films such as ruthenium by using copper CVD or ALD. In this way, the fabrication of conducting copper interconnects can be achieved directly in one step and may avoid the need for first creating a copper seed layer which is then subjected to copper electroplating. The direct filling of small vias and trenches may be especially attractive for those embodiments that are >45 nanometers (nm) wide since filling them with conventional PVD copper seed/electroplating may be very challenging due to the non-conformal copper seed. While not wishing to be bound by theory, it is believed that when a conformal copper films starts to be deposited inside such a via or trench to achieve full copper fill, it may be advantageous if the copper growth occurs preferentially onto the barrier liner rather than growing onto copper that was previously deposited. This suppresses individual copper grain growth from occurring at the expense of forming a continuous copper film. Thus, the copper film builds in a controlled manner inside the via or trench and avoids the formation of voids which can occur when large copper grains grow towards each other from opposite sidewalls of the via or trench until they finally touch leaving spaces between them. Additionally, since the copper growth rate greatly diminishes once the ruthenium is completely covered over to a certain depth, the overgrowth of copper on top of the vias and trenches (i.e. 'overburden') is avoided thereby decreasing the amount of copper to remove later by chemical mechanical polishing. This self termination of copper film growth also aids in allowing better process control of the final copper film thickness since deposition beyond the maximum film thickness results in no further copper growth.

As mentioned previously, certain embodiments of the process described herein uses one or more copper precursors that have the following formulas (Ia), (Ib), or (II):

(Ia)

-continued

In the above formulas, M is a metal selected from Cu, Au, Ag, Co, Ru, Rh, Pt, In, Pd, Ni, and Os. In certain embodiments, metal atom M is copper. In formula (Ib), X can be oxygen thereby forming a ketoiminate complex, or alternatively X can be $NR^5$ thereby forming a diiminate complex. In the above formulas, substituents $R^1$, $R^2$, $R^3$, and $R^5$ (in embodiments where X is not 0 in formula Ib) are each independently selected from a hydrogen atom; a halogen atom; a nitro group having a formula $NO_2$; an alkyl having a formula $C_nH_{2n+1}$ wherein n is a number ranging from 1 to 20; a fluoroalkyl having the formula $C_nH_xF_y$ wherein the product of the (x+y) equals the product of (2n+1) and n is a number ranging from 1 to 20; an alkylsilane having a formula $(R^6)_3Si$ wherein $R^6$ is each independently an alkyl, an alkoxy or an amide comprising from 1 to 20 carbon atoms; an aryl group comprising from 6 to 12 carbon atoms; an alkyl-substituted aryl comprising from 6 to 12 carbon atoms; a fluoroalkyl substituted aryl comprising from 6 to 12 carbon atoms; a fluoroaryl comprising from 6 to 12 carbon atoms; an ether having a formula $(CH_2)_nO(C_mH_{2m+1})$ where n and m are independently a number ranging from 1 to 20; a fluoroether having a formula $(C_nH_xF_y)O(C_mH_wF_z)$ wherein (x+y)=2n, (w+z)=(2m+1), and n and m are each independently a number ranging from 1 to 20; a silylether having a formula $(R^7)_3SiO$ wherein $R^7$ is each independently an alkyl comprising from 1 to 20 carbon atoms or an aryl comprising from 6 to 12 carbon atoms; an alkoxy comprising from 1 to 20 carbon atoms; and an amide comprising from 1 to 20 carbon atoms. In the above formulas, substituent $R^4$ is selected from an alkyl having a formula $C_nH_{2n+1}$, wherein n is a number ranging from 1 to 20; a fluoroalkyl having the formula $C_nH_xF_y$ wherein the product of the (x+y) equals the product of (2n+1) and n is a number ranging from 1 to 20; an alkylsilane having a formula $(R^6)_3Si$ wherein $R^6$ is each independently an alkyl, an alkoxy or an amide comprising from 1 to 20 carbon atoms; an aryl comprising from 6 to 12 carbon atoms; an alkyl-substituted aryl comprising from 6 to 12 carbon atoms; a fluoroalkyl substituted aryl comprising from 6 to 12 carbon atoms; a fluoroaryl comprising from 6 to 12 carbon atoms; an ether having a formula $(CH_2)_nO(C_mH_{2m+1})$ where n and m are independently a number ranging from 1 to 20; a fluoroether having a formula $(C_nH_xF_y)O(C_mH_wF_z)$ wherein (x+y)=2n, (w+z)=(2m+1), and n and m are each independently a number ranging from 1 to 20; a silylether having a formula $(R^7)_3SiO$ wherein $R^7$ is each independently an alkyl group comprising from 1 to 20 carbon atoms or an aryl comprising from 6 to 12 carbon atoms; an alkoxy comprising from 1 to 20 carbon atoms; and an amide comprising from 1 to 20 carbon atoms and wherein $R^4$ has a hydrogen, an atom, or a group removed to associate with L. Further, in the above formulas, L is a ligand is a ligand selected from an alkylnitrile comprising from 2 to 20 carbon atoms; a silylnitrile having the formula $(R^8)_3SiCN$ wherein $R^8$ is each independently an alkyl, an alkoxy, or an amide comprising from 1 to 20 carbon atoms; an alkyne comprising from 1 to 20 carbon atoms; a silylalkyne having a formula $(R^9)_3SiCCR^{10}$ wherein $R^9$ is each independently an alkyl, an amide, or an alkoxy comprising from 1 to 20 carbon atoms and $R^{10}$ is hydrogen, an alkoxy, an amide, or an alkyl comprising from 1 to 20 carbon atoms; a silylalkyne having a formula $(R^{11})_3SiCCSi(R^{11})_3$ wherein $R^{11}$ is each independently an alkyl, an amide, or an alkoxy comprising from 1 to 20 carbon atoms; an alkene, diene, or triene comprising from 1 to 20 carbon atoms; a silylalkene having a formula $(R^{12})_3SiCR^{13}C(R^{13})_2$ wherein $R^{12}$ is each independently an alkyl, an alkoxy, vinyl, an aryl, or an amide comprising from 1 to 20 carbon atoms and $R^{13}$ is each independently a hydrogen or an alkyl comprising from 1 to 20 carbon atoms; a bis(silyl)alkene having the formula $(R^{14})_3SiCR^{13}CR^{13}Si(R^{14})_3$ wherein $R^{14}$ is each independently an alkyl, an alkoxy, or an amide comprising from 1 to 20 carbon atoms and $R^{13}$ is each independently a hydrogen atom or an alkyl comprising from 1 to 20 carbon atoms; an allene comprising from 3 to 20 carbons; an allene having a formula $(R^{15})_2CCC(R^{15})_2$ where $R^{15}$ is each independently a hydrogen atom, an alkyl silane having a formula $(R^{16})_3Si$ wherein $R^{16}$ is each independently an alkyl, an amide, or an alkoxy comprising from 1 to 20 carbon atoms; an alkylisocyanide having a formula $R^{17}NC$ wherein $R^{17}$ is an alkyl comprising from 1 to 20 carbon atoms; a silylisocyanide having a formula $(R^{18})_3SiNC$ wherein $R^{18}$ is each independently an alkyl, amide, or alkoxy comprising from 1 to 20 carbon atoms; and an aryl group comprising from 6 to 12 carbon atoms and wherein L has a hydrogen, an atom, or a group removed to associate with $R^4$.

The term "alkyl" as used herein includes straight chain, branched, or cyclic alkyl groups, comprising from 1 to 20 carbon atoms or from 1 to 10 carbon atoms. Exemplary alkyl groups include methyl, ethyl, n-propyl, isopropyl, n-butyl, isobutyl, sec-butyl, tert-butyl, tert-amyl, n-pentyl, n-hexyl, cyclopentyl, and cyclohexyl. The term "alkyl" also applies to alkyl moieties contained in other groups such as haloalkyl, alkylaryl, or arylalkyl. The term "aryl" as used herein comprises 6 to 18 member carbon rings having aromatic character. Exemplary aryl groups include phenyl and napthyl groups. The term "alkyl-substituted aryl" applies to aryl moieties that are alkyl substituted. Exemplary alkyl-substituted aryl groups include tolyl and xylyl groups. The terms "halo" and "halogen" include fluorine, chlorine, bromine, or iodine. The term "fluoroalkyl" applies to alkyl moieties wherein one or more of its hydrogen atoms are replaced by a fluorine halogen atom, may be partially or fully fluorinated, and includes straight chain, branched or cyclic fluorinated alkyl groups comprising from 1 to 20 carbon atoms or from 1 to 10 carbon atoms. Exemplary fluoroalkyl groups include —$CF_3$, —$CF_2CF_3$, —$CH_2CF_3$, —$CF_2CFH_2$, or —$CH_2CF_2CF_3$. In certain embodiments, some of the groups discussed herein may be substituted with one or more other elements such as, for example, a halogen atom or other heteroatoms such as O, N, Si, or S.

In formulas (Ia) or (Ib), substituent $R^4$ is selected such that it can associate with the ligand L. Further, ligand L is selected such that it can associate with $R^4$. It is believed that both ligand L and substituent $R^4$ have a hydrogen, atom, or group removed that allows $R^4$ and L to associate thereby connecting the ketoimine or diimine ligand of the complex with ligand L.

In this connection, when L is silylalkene, one of its bonds is available to associate with R⁴. One exemplary embodiment is Cu(MeC(O)CHC(NCH₂CH₂OSiMe₂(C₂H₃))Me). In this embodiment, X is oxygen, L has the formula H₂C=CHSiMe₂, R⁴ is OCH₂CH₂, R³ is hydrogen, and R¹ and R² are both methyl groups. In another embodiment where X is NR⁵, R⁵ and L can associate. In this embodiment, both ligand L and substituent R⁵ have a hydrogen, atom, or group removed that allows R⁵ and L to associate in the same fashion as R⁴ and L are associated.

In certain embodiments, substituent R⁴ may also be connected to substituents R¹, R² and/or R³. In these embodiments, substituent R⁴ can only connect with substituents R¹, R² and/or R³ when R¹, R² and/or R³ are neither a hydrogen atom, a halogen atom, nor the nitro group NO₂.

In certain embodiments of the complex described herein, X is NR⁵ and R⁵ can be any of the groups or atoms described above for R¹, R², or R³. In these embodiments, ligand (L), or alternatively an additional ligand (L) which can be any of the groups or atoms described above, can also be attached to substituent R⁵ as well as substituent R⁴. In these embodiments, it is believed that at least one ligand L has, for example, an available valence with which to associate with R⁵ thereby connecting the diimine ligand of the complex with ligand L. In this or other embodiments, substituent R⁵ can also be connected to any one or all of substituents R¹, R², R³, and/or R⁴ to form cyclic structures. In the latter embodiment, substituent R⁵ connects with substituents R¹, R² and/or R³ only when R¹, R² and/or R³ are neither a hydrogen atom, a halogen atom, nor the nitro group NO₂, or alternatively when R⁵ is a hydrogen atom.

In certain embodiments, substituent R⁴, and/or optionally substituent R⁵ if X is NR⁵, may be adjusted such that the ligand L coordinates to the metal center of an adjacent complex rather than to its own metal center. In these embodiments, other complexes such as, but not limited to, dimeric, trimeric, and tetrameric complexes can form.

In certain embodiments, any one or all of substituents R¹, R², and R³ can be independently connected to form cyclic structures. In certain embodiments, R¹ and R² and/or R² and R³ can be independently connected to form cyclic structures.

In certain embodiments, the copper precursors described herein may contain fluorine. In these embodiments, any one or all of substituents R¹, R², R³, R⁴ or R⁵ may contain fluorine such as, for example, a fluoroalkyl, a fluoroalkyl-substituted aryl, a fluoroaryl, an alkyl-substituted fluoroalkyl, or a fluoroalkyl-substituted fluoroaryl group. In alternative embodiments, the copper precursors described herein do not contain fluorine. Examples of copper precursors containing fluorine include but are not limited to, Cu(CF₃C(O)CHC(NCH₂CH₂OSiMe₂C₂H₃)CF₃), Cu(CF₃C(O)CHC(NCH₂CH₂OSiMe₂C₂H₃)Me),

Cu(CF₃C(O)CHC(NCH₂CH₂NMeSiMe₂C₂H₃)CF₃),

Cu(CF₃C(O)CHC(NCH₂CH₂NMeSiMe₂C₂H₃) Me),

Cu(CF₃C(O)CHC(NCH₂CHMeOSiMe₂C₂H₃)CF₃), and

Cu(CF₃C(O)CHC(NCH₂CHMeOSiMe₂C₂H₃)Me).

In certain embodiments, the metal complex has the formula (II). In these embodiments, ligand L may be for example, an alkyne or diene, and is coordinated to two metal-containing ketoimine units as shown below in formula (II). In these embodiments, metal atom M may be the same, or alternatively different, metal atoms. In the later embodiments, this may allow for the deposition of mixed metal films.

In one embodiment, ligand L in any of the above formulas may be an alkylnitrile such as, but not limited to, CH₂CN or Me₂CH₂CCN. In this and the foregoing embodiments for L, the groups defined for ligand L may have a hydrogen removed to allow to associate with R⁴. In an alternative embodiment, ligand L may be a silylnitrile such as but not limited to Me₂CH₂SiCN. In a further embodiment, ligand L may be an alkyne such as but not limited to CH₂CCMe or CH₂CCH. In another embodiment, ligand L may be an alkene such as but not limited to Me₃CCHCH₂ or Me(CH₂)₂CHCH₂. In a still further embodiment, ligand L may be an allene such as but not limited to CHCCCH₂ or MeCCCMe₂. In one embodiment, ligand L may be an alkylnitrile such as, but not limited to, MeCN or Me₃CCN. In a further embodiment, ligand L may be an alkyne such as but not limited to MeCCMe or MeCCH. In yet another embodiment, ligand L may be a silylalkene having the formula (R¹⁰)₃SiCR¹⁷C(R¹⁷)₂ or a bis(silyl)alkene having the formula (R¹¹)₃SiCR¹⁷CR¹⁷Si(R¹¹)₃ such as but not limited to Me₃SiCHCH₂, Me₃SiCHCHSiMe₃, (MeO)₃SiCHCH₂, or (EtO)₃SiCHCH₂. In another embodiment, ligand L may be an alkylisocyanide such as but not limited to Me₃CNC. In a further embodiment, ligand L may be an allylsilane having the formula (R¹⁵)₃SiC(R¹⁷)₂CR¹⁷C(R¹⁷)₂ such as but not limited to (MeO)₃SiCH₂CHCH₂, (i-Pr)₃SiCH₂CHCH₂ and Me₃SiCH₂CHCH₂. In the aforementioned formulas and throughout the specification, the term "Me" indicates a methyl group, "Et" indicates an ethyl group, and "i-Pr" indicates an isopropyl group.

In the above formula (I), the organometallic bond between the metal or copper atom and ligand (L) is either 2 single bonds or 1 single bond. In certain embodiments, the bond energy between at least one of the copper atoms to L, copper atom to O, and/or copper atom to N may be weaker than the bond energies found in the balance of the complex. It is believed that this may allow, in certain instances and under certain process conditions, for the complex to be readily dissociated at these particular bonds into its constituent components.

In other embodiments, the copper precursor may be any one of the copper precursors used in the art of copper film deposition, particularly CVD or ALD deposition. Two of often-used families of copper organometallic precursors have been used for CVD, ALD, or other depositions are the Cu(I) and Cu(II) precursors. One commonly used Cu(I) precursor is a precursor having the formula "Cu(I)(hfac)(W)" precursor where "hfac" represents the 1,1,1,5,5,5-hexafluoro-2,4-pentanedionate anion and (W) represents a neutral stabilizing ligand, such as, for example, an olefin, an alkyne, or a trialkylphosphine. One particular example of a Cu(I) precursor having the aforementioned formula is 1,1,1,5,5,5-hexafluoro-2, 4-pentanedionato-copper (i) trimethylvinylsilane (hereinafter Cu(hfac)(tmvs)), which is sold under the trademark CUPRASELECT™ by Air Products and Chemicals, Inc. of Allentown, Pa., the assignee of the present application. Yet another type of Cu(I) precursor is a precursor having the formula "(X) Cu(Y)". In these particular Cu(i) precursors, "X" is an organic anion and "Y" is a neutral stabilizing ligand, such as, for example, trialkyphosphine. An example of such a precursor is CpCuPEt$_3$, where Cp is cyclopentadienyl and PEt$_3$ is triethylphoshine. An example of a Cu(II) precursor that can be used in the process described herein has the chemical formula Cu(II)(Z)$_2$ wherein (Z) is an organic anion. Examples of this type of precursor include, but are not limited to, Cu(II)bis(β-diketonates), Cu(II) bis(β-diimine), and Cu(II) bis(β-ketoimine) complexes. Still further examples of other copper precursors include, but are not limited to, copper formate and Cu (II) ethyl acetoacetate.

As mentioned previously, the copper precursor described herein may be used as precursor for the deposition of a copper, copper-containing, or alloy thereof film onto a substrate. Examples of suitable substrates include but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO$_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, or diffusion barrier layers. The copper precursor may be deposited using any of the techniques described herein or known in the art. Exemplary deposition techniques include, but are not limited to, chemical vapor deposition (CVD), atomic layer deposition (ALD), pulsed CVD, plasma-assisted chemical vapor deposition (PACVD), and plasma-enhanced chemical vapor deposition (PECVD).

In certain embodiments, the copper precursors are deposited onto a substrate using a CVD or ALD technique. In certain embodiments, the deposition of the copper precursor may be conducted at temperatures of 400° C. or below, or 200° C. or below, or 100° C. or below. In a typical CVD deposition process, the copper precursor is introduced into a reaction chamber such as a vacuum chamber. In certain embodiments, other chemical reagents, besides the copper precursor, may be introduced before, during, and/or after the introduction of the copper precursor. An energy source, such as, for example, thermal, plasma or other source, energizes the copper precursor and optional chemical reagents thereby forming a film on at least a portion of the substrate.

The ruthenium containing layer that acts as a barrier layer, seed layer, and/or glue layer may be deposited using one or more organometallic precursors such as, but not limited to, bis(cyclopentadienyl)ruthenium, tris(2,2,6,6-tetramethyl-3,5-heptanedioneate)ruthenium, ruthenium acetylacetonate, and ruthenium carbonyl. Deposition of the ruthenium-containing layer may be conducted using any of the processes described herein or other methods known in the art.

As mentioned previously, in certain embodiments, a chemical reagent may be introduced before, during, and/or after the introduction of the copper precursor into the reaction chamber. The choice of chemical reagent may depend upon the composition of the desired resultant films. For example, in one embodiment, reaction with a halogen-containing chemical reagent may form a film of metal halide, whereas in another embodiment, reaction with an oxidant chemical reagent will yield a metal oxide film. Exemplary chemical reagents include, but are not limited to oxidants (i.e., O$_2$, NO, NO$_2$, O$_3$, CO, CO$_2$, etc.); water; halides; halogen-containing silanes; alkylchlorosilanes, alkylbromosilanes, or alkyliodosilanes; silicon halide complexes such as silicon tetrachloride, silicon tetrabromide, or silicon tetraiodide; halogenated tin complexes such as tetralkylstannanes, alkylchlorostannanes, alkylbromostannanes, or alkyliodostannanes; germane complexes such as alkylchlorogermanes, alkylbromogermanes, or alkyliodiogermanes; boron trihalide complexes such as borontrichloride, boron tribromide, or boron triodide; aluminum halide complexes such as aluminum chloride, aluminum bromide, or aluminum iodide; alkylaluminum halides; gallium halide complexes such as gallium trichloride, gallium tribromide, or gallium triodide; or combinations thereof. It is also envisioned that derivatives of the above complexes may also be used. The chemical reagents may be delivered directly as a gas to the reaction chamber, delivered as a vaporized liquid, a sublimed solid and/or transported by an inert carrier gas into the reaction chamber. Examples of inert carrier gases include nitrogen, hydrogen, argon, xenon, etc.

In another embodiment, a film comprising any one of the metals described herein may be deposited onto the surface of a substrate in the presence of a reducing agent to, for example, reduce the film to desired metal. In one embodiment, a copper precursor having the formula (I) may be introduced into a CVD or ALD reactor along with a reducing agent. The reducing agent is typically introduced in gaseous form. Examples of suitable reducing agents include, but are not limited to, alcohols, carboxylic acids, hydrogen gas, hydrogen plasma, remote hydrogen plasma, silanes (i.e., diethylsilane, ethylsilane, dimethylsilane, phenylsilane, silane, disilane, aminosilanes), boranes (i.e., borane, diborane), alanes, germanes, hydrazines, ammonia, or mixtures thereof. In one particular embodiment, the reducing agent is formic acid.

In certain embodiments, a copper film is deposited from the copper precursor having formula (I) via an ALD deposition process. During a typical ALD process, one or more gaseous or vaporized precursors are introduced into the process chamber which houses the substrate in alternating pulses within a process cycle. Preferably, each process cycle forms no more than about one monolayer of material by adsorption and preferably by chemisorption. The number of process cycles used to grow the layer depends on the thickness desired but may generally exceed 1,000 or more cycles. For semiconductor devices, the process cycle is repeated until the barrier or seed layer within the dual damascene structure has a thickness sufficient to perform its desired function.

During ALD processing, the substrate is kept at a temperature range that facilitates chemisorption, i.e., is low enough to maintain intact bonds between adsorbed species and the underlying substrate yet high enough to avoid condensation of the precursors and to provide sufficient activation energy for the desired surface reactions in each process cycle. The process chamber temperature may range from 0° C. to 400° C., or from 0° C. to 300° C., or from 0° C. to 275° C. The pressure within the process chamber during ALD processing may range from 0.1 to 1000 Torr, of from 0.1 to 15 Torr, or from 0.1 to 10 Torr. It is understood, however, that the temperature and pressure for any particular ALD process may vary depending upon the one or more precursors involved.

Any of the aforementioned film formation methods described herein, as well as other film formation methods known in the art, may be used alone or in combination. Other deposition methods that may be used include, for example, ionized metal plasma (IMP), physical vapor deposition (PVD), chemical vapor deposition (CVD), atomic layer deposition (ALD), plasma-assisted chemical vapor deposition (PACVD), plasma-enhanced chemical vapor deposition (PECVD), electroplating, and electroless plating. For example, in one embodiment, a mixed composition copper-containing film may be formed by sequentially depositing a copper oxide film followed by a copper metal film and then reducing the multilayers to provide a pure copper film.

In certain embodiments, the copper precursor described herein may be dissolved in a suitable solvent such as an amine (e.g., triethylamine), an ether (e.g., THF), an aromatic (e.g., toluene) or any other solvent disclosed herein, to form a solution. The resulting solution may be flash vaporized in a Direct Liquid Injection (DLI) system for vapor delivery into an ALD or CVD reaction chamber. In other embodiments, the complexes described herein can be dissolved in a stabilizing liquid such as olefins or alkynes prior to introduction to a DLI system.

EXAMPLES

Example 1

Selective Deposition of $Cu((CH_2)_3NCCHC(NCH_2CH_2OSiMe_2C_2H_3)Me)$

Precursor onto Ruthenium rather than Copper Substrate

A silicon wafer bearing an approximately 200 Angstrom thick copper film (which was deposited by physical vapor deposition and having a purity of 99.999%) was cut into 3 equal sample pieces, namely C1, C2, and C3. A 2.0 gram sample of the copper precursor $Cu((CH_2)_3NCCHC(NCH_2CH_2OSiMe_2C_2H_3)Me)$ was loaded into the source container of a laboratory scale reactor adapted for ALD processing and sealed under nitrogen. The temperature of the container was then adjusted to 90° C. A sample of a ruthenium substrate, R1 and the copper sample C1 were loaded into the process chamber of the ALD reactor and pure hydrogen gas was passed over them in a continuous flow of 20 square cubic centimeters per minute (sccm) at 0.5 Torr pressure. The temperature of the substrates was adjusted to 375° C. and held for one hour with the continuous flow of pure hydrogen gas in order to reduce any native copper oxide present on the surface of the copper substrate to metallic copper.

In a separate experiment, an identical copper sample, C2, was heated in an air atmosphere for 1 hour at 175° C. to create a visible purple layer of copper oxide. The copper sample C2 was heated to 375° C. under 20 sccm of hydrogen for one hour and its color was restored back to copper metal. This demonstrated that the reduction process for the copper substrate was effective.

In a separate experiment, copper sample C3 was cross-sectionally imaged by Transmission Electron Microscopy (TEM).

Figure 1:
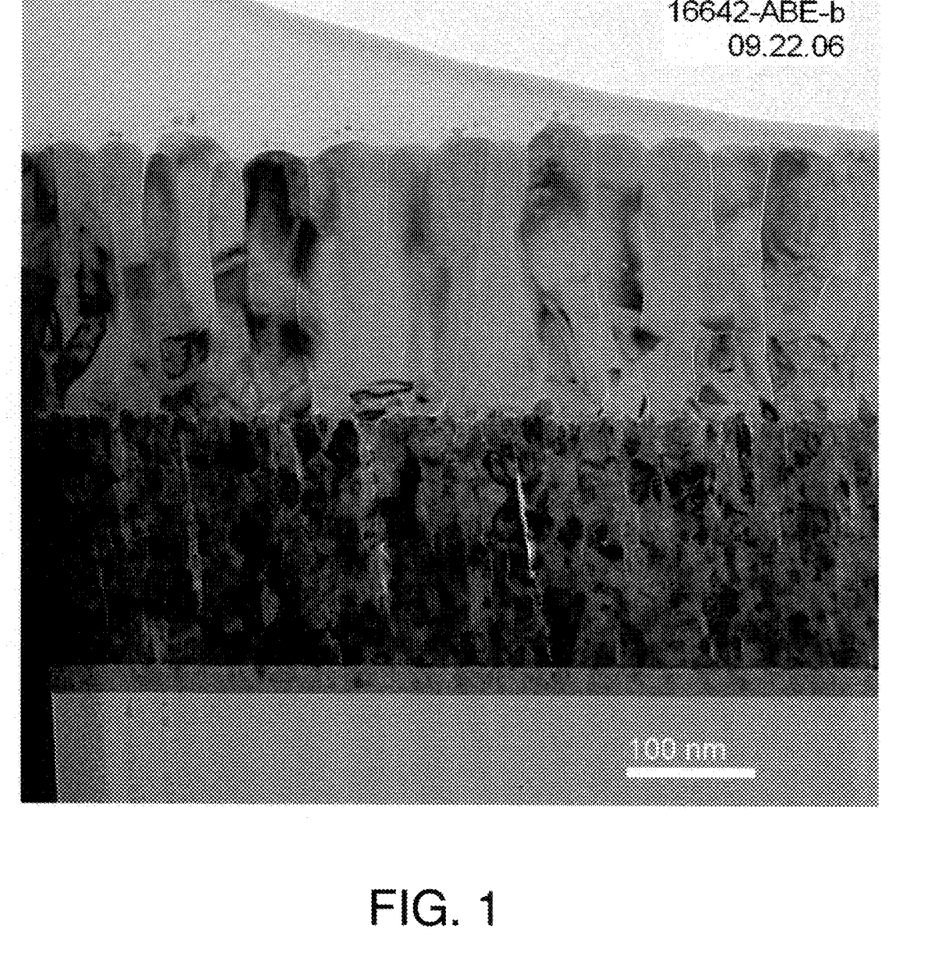
FIG. 1 provides a photograph taken by Transmission Electron Microscopy (TEM) of a ruthenium substrate having a continuous copper layer that was deposited by ALD using the $Cu((CH_2)_3NCCHC(NCH_2CH_2OSiMe_2C_2H_3)Me)$ precursor as described in Example 1.
Figure 2:
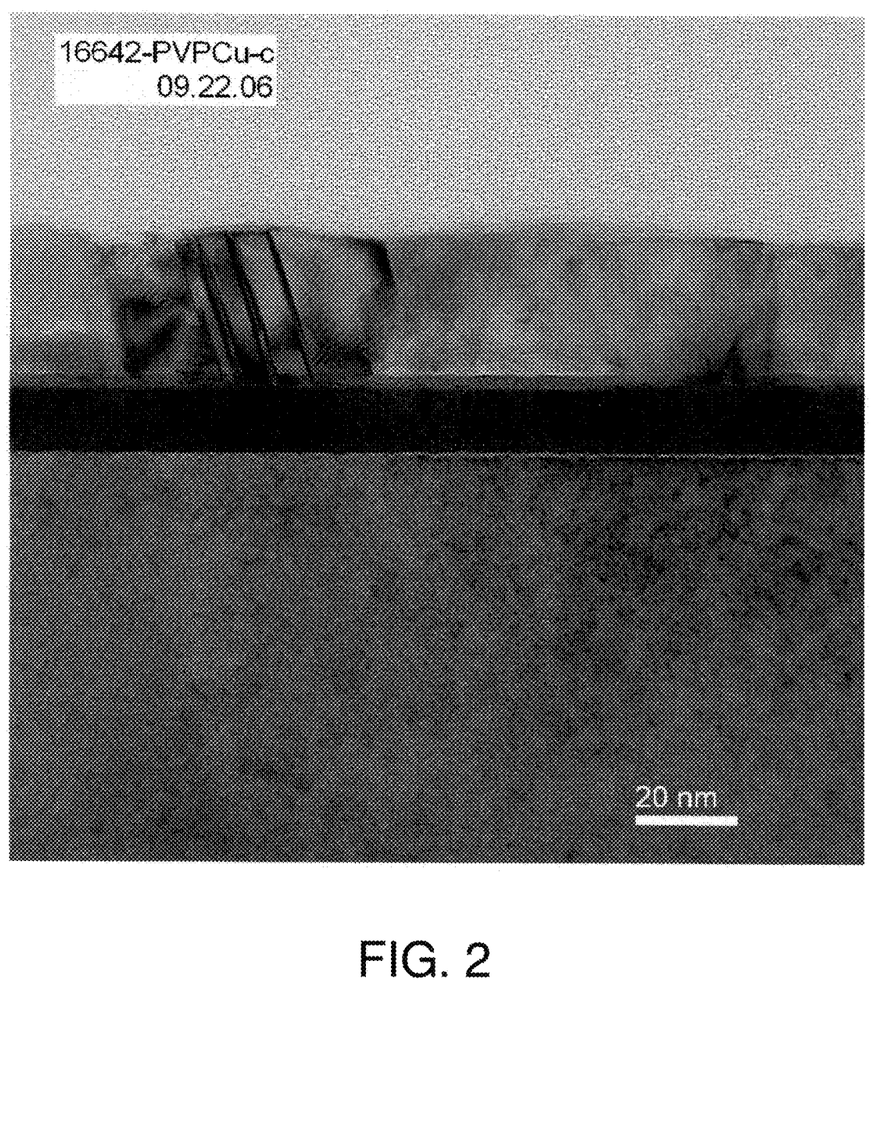
FIG. 2 provides a photograph taken by TEM of a copper substrate prior to exposure to ALD cycles and hydrogen anneal cycle as described in Example 1.
Figure 3:
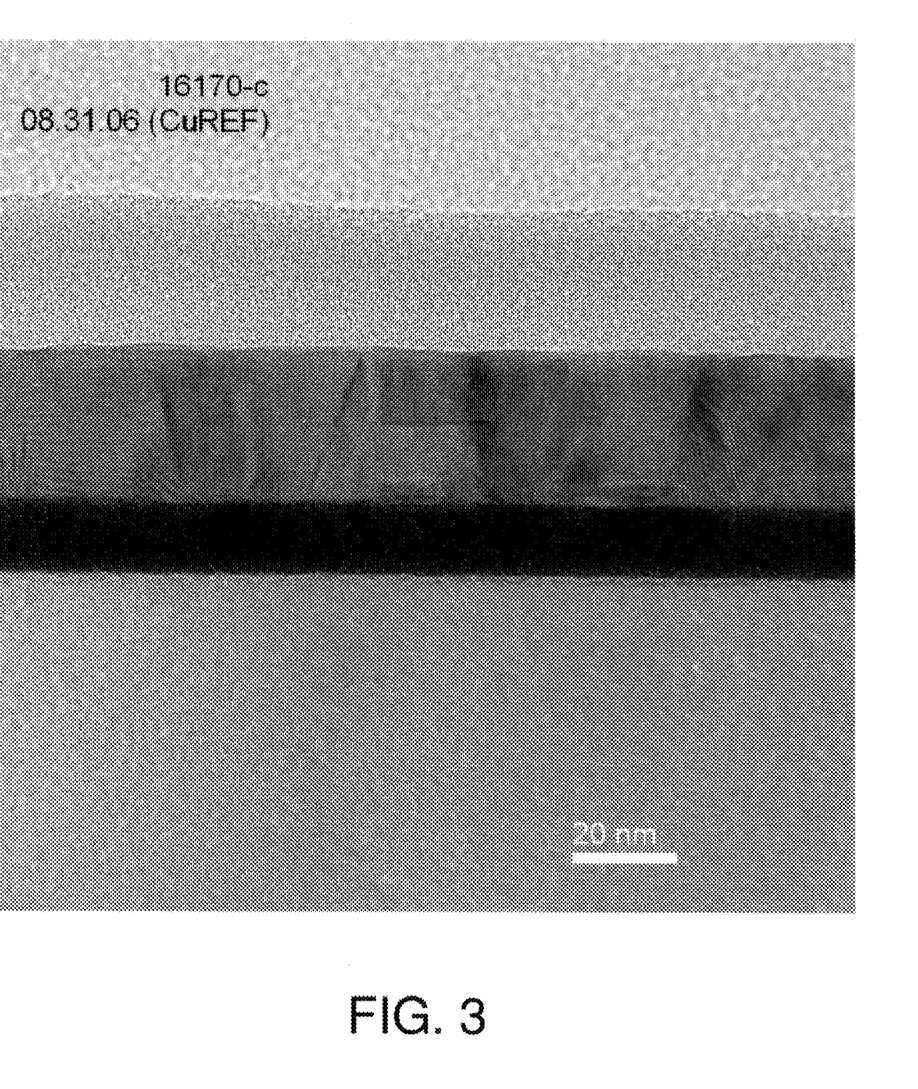
FIG. 3 provides a photograph taken by TEM of a copper substrate after a hydrogen anneal cycle then multiple ALD cycles and as described in Example 1.

After heating the copper and ruthenium samples C1 and R1 in the ALD reactor at 375° C. under 20 sccm of hydrogen for one hour, the samples were cooled to 150° C. under hydrogen flow. The ALD reactor sequence was then started wherein the copper precursor, nitrogen, hydrogen, nitrogen, and copper precursor were each individually pulsed at times of 15, 5, 60, 5, and 15 seconds, respectively, per cycle, for a total of 2372 cycles. The reactor was then cooled and the substrates removed for TEM imaging The TEM result for the ruthenium substrate R1 clearly indicate a thick copper deposit of ~2000 Å, as shown in FIG. 1 with a magnification reference bar of 100 nm. Second, substantially no additional copper was deposited on the copper sample C1, which was confirmed by comparing its TEM image (FIG. 2) to that of copper sample C3 (FIG. 3). Both FIGS. 2 and 3 show that copper substrates C1 and C3 have substantially identical thicknesses, although it is noted that the surface of C1 is seen to be slightly rougher than that of C3 due to the former undergoing a thermal anneal at 375° C. for one hour. Thus, it appears demonstrated that copper is selectively deposited onto ruthenium and not copper.

Example 2

Selective Deposition of a $Cu(CF_3C(O)CHC(NCH_2CH_2OSiMe_2C_2H_3)CF_3)$

Precursor onto Ruthenium rather than Copper Substrate

A copper precursor $Cu(CF_3C(O)CHC(NCH_2CH_2OSiMe_2C_2H_3)CF_3)$ was loaded into same ALD reactor as described in Example 1 along loaded with four different ruthenium substrates along with a PVD copper substrate. The system was run using the same cycle times for precursor, nitrogen and hydrogen as above in addition to using the same 375° C. preheat in hydrogen followed by cooling to 150° C. then initiating 670 ALD cycles. No copper deposition was observed on the PVD copper, but 200 Å Angstroms of copper was seen by TEM to deposit on the ruthenium samples.

In both the results using the two different precursors described in Examples 1 and 2, the ALD copper was selectively grown onto the ruthenium and not the PVD copper substrate and confirmed by Auger spectroscopy.

What is claimed is:

1. A process for preparing a multi-layered substrate comprising a first layer and a second layer, the process comprising:
   providing the first layer comprising a ruthenium area and a copper area; and
   depositing the second layer comprising copper onto the first layer using at least one precursor having any one of the formula (Ib) to provide the (Ib)

wherein M is copper;
wherein X is selected from oxygen and $NR^5$;
wherein $R^1$, $R^2$, $R^3$, and $R^5$ are each independently selected from a hydrogen atom; an alkyl having a formula $C_nH_{2n+1}$ wherein n is a number ranging from 1 to 20; a fluoroalkyl having the formula $C_nH_xF_y$ wherein the product of the (x+y) equals the product of (2n+1) and n is a number ranging from 1 to 20,
wherein $R^4$ is selected from an alkyl having a formula $C_nH_{2n+1}$ wherein n is a number ranging from 1 to 20; an alkoxy comprising from 1 to 20 carbon atoms; and wherein $R^4$ associates with L by having a hydrogen, an atom, or a group removed,
wherein L is a ligand selected from an alkylnitrile comprising from 2 to 20 carbon atoms; a silylnitrile having the formula $(R^8)_3SiCN$ wherein $R^8$ is each independently an alkyl, an alkoxy, or an amide comprising from 1 to 20 carbon atoms; an alkyne comprising from 1 to 20 carbon atoms; a silylalkyne having a formula $(R^8)_3SiCCR^{10}$ wherein $R^9$ is each independently an alkyl, and $R^{10}$ is hydrogen or an alkyl comprising from 1 to 20 carbon atoms; a silylalkyne having a formula $(R^{11})_3SiCCSi(R^{11})_3$ wherein $R^{11}$ is each independently an alkyl comprising from 1 to 20 carbon atoms; an alkene, diene, or triene comprising from 1 to 20 carbon atoms; a silylalkene having a formula $(R^{12})_3SiCR^{13}C(R^{13})_2$ wherein $R^{12}$ is each independently an alkyl, an alkoxy, an aryl, a vinyl, or an amide comprising from 1 to 20 carbon atoms and $R^{13}$ is each independently a hydrogen, an alkyl comprising from 1 to 20 carbon atoms, a bis(silyl)alkene having the formula $(R^{14})_3SiCR^{13}CR^{13}Si(R^{14})_3$ wherein $R^{14}$ is each independently an alkyl comprising from 1 to 20 carbon atoms and $R^{13}$ is each independently a hydrogen atom or an alkyl comprising from 1 to 20 carbon atoms; and an allene comprising from 3 to 20 carbons and wherein L associates with $R^4$ by having a hydrogen, an atom, or a group removed;

wherein an organometallic bond between M and L is selected from 2 single bonds and 1 single bond; and wherein the depositing provides the second layer comprising:

a first thickness ranging from about 20 Angstroms to about 2,000 Angstroms onto the ruthenium area and a second thickness onto the copper area that is at least 90% less than the first thickness, and wherein at least a portion of the depositing step is conducted in the presence of a reducing agent.

2. The process of claim 1 wherein any one of X, $R^1$, $R^2$, $R^3$ and $R^4$ are connected to form a cyclic structure.

3. The process of claim 1 wherein X and $R^1$ and connected to form a cyclic structure.

4. The process of claim 1 wherein the reducing agent is at least one chosen from an alcohol, a carboxylic acid, hydrogen gas, hydrogen plasma, remote hydrogen plasma, a silane, a borane, an alane, a germane, a hydrazine, ammonia, and mixtures thereof.

5. The process of claim 1 wherein the thickness of the second layer is substantially 0.

6. The process of claim 1 wherein the precursor having formula (Ib) is $Cu((CH_2)_3NCCHC(NCH_2CH_2OSiMe_2C_2H_3)Me)$.

7. The process of claim 1 wherein the precursor having formula (Ib) is $Cu(CF_3C(O)CHC(NCH_2CH_2OSiMe_2C_2H_3)CF_3)$.

* * * * *